United States Patent
Rice et al.

(10) Patent No.: US 6,847,044 B2
(45) Date of Patent: Jan. 25, 2005

(54) ELECTRICAL DISCHARGE GAS PLASMA EUV SOURCE INSULATOR COMPONENTS

(75) Inventors: Bryan J. Rice, Hillsboro, OR (US); Kramadhati V. Ravi, Atherton, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/335,094

(22) Filed: Dec. 31, 2002

(65) Prior Publication Data

US 2004/0124373 A1 Jul. 1, 2004

(51) Int. Cl.⁷ .................................................. H01J 61/04
(52) U.S. Cl. .................................................. 250/504 R
(58) Field of Search .................................... 250/504 R

(56) References Cited

U.S. PATENT DOCUMENTS

| | | | |
|---|---|---|---|
| 5,204,145 A | * | 4/1993 | Gasworth ..................... 427/577 |
| 6,414,438 B1 | * | 7/2002 | Borisov et al. ........... 315/111.31 |
| 6,621,022 B1 | | 9/2003 | Ma et al. |
| 2002/0029977 A1 | * | 3/2002 | Natishan et al. ............ 205/413 |
| 2003/0064225 A1 | * | 4/2003 | Ohashi et al. ............... 428/408 |

* cited by examiner

Primary Examiner—John R. Lee
Assistant Examiner—Phillip A Johnston
(74) Attorney, Agent, or Firm—Schwabe, Williamson & Wyatt, P.C.

(57) ABSTRACT

A diamond insulator collar and methods for fabricating a diamond insulator collar for electrical discharge gas plasma EUV source. The insulating collar is positioned at the base of the central electrode in the pre-ionization region of the plasma head. The insulating collar prevents electrical shorting between the outer electrode and the central electrode in this region. In one embodiment of a method for providing a wire mesh-reinforced diamond insulator collar, a mandrel is provided that replicates the shape of the base of the central electrode. A wire mesh is wrapped around the mandrel conforming to the shape of the mandrel. The wire mesh is coated with electrically insulating diamond using known plasma enhanced chemical vapor deposition (CVD) techniques to form a non-porous coating. The mandrel is removed from the diamond-coated wire mesh providing a porous-free wire-reinforced diamond insulator collar. Embodiments of non-wire reinforced collars are presented.

26 Claims, 4 Drawing Sheets

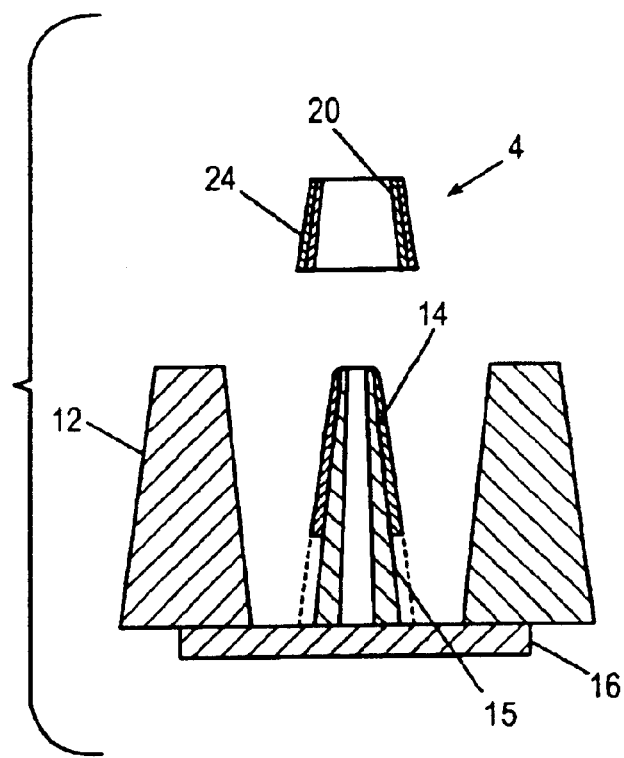
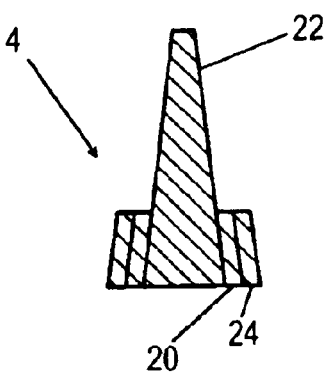
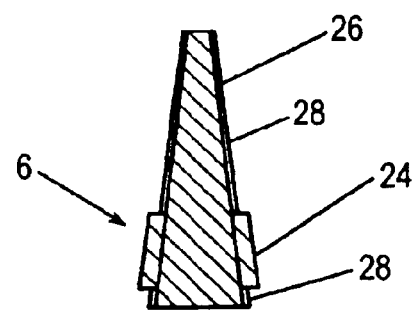

ELECTRICAL DISCHARGE GAS PLASMA EUV SOURCE INSULATOR COMPONENTS

FIELD OF THE INVENTION

The present invention relates to extreme ultraviolet lithography, and more particularly, to insulating components for electrical discharge gas plasma EUV sources.

BACKGROUND OF INVENTION

Extreme ultraviolet lithography is a promising technology for resolving integrated circuit (IC) feature sizes of 50 nm and below. There are many problems in order to realize EUV lithography and the most serious problem is to develop the EUV radiation source. An EUV source with a collectable radiation power of 50 W to 150 W at over 5 kHz in the spectral range of 13–14 nm will be required to achieve requirements for high volume manufacturing of 300 mm wafers.

Electrical discharge gas plasma devices (EUV lamps) are under investigation as promising EUV sources. The principle consists of heating up certain materials into plasma to such a level that the material emits EUV radiation. Potential source materials that emit EUV radiation at excited energy levels include xenon, oxygen, and lithium. The aim is to produce as many photons as possible in the required wavelength range. A pulsed discharge of electrically stored energy across a gap between an outer electrode and a central electrode is used in the presence of the gas for the creation of plasma with temperatures of several 100,000 C. This plasma emits radiation in the spectral range of around 10 nm to 20 nm.

FIG. 1 is a cross-sectional view of a basic representation of an electrical discharge gas plasma head 10 capable of producing EUV-emitting plasma 20. The plasma head 10 comprises an electrically conductive annular outer electrode 12 electrically insulated from a centrally positioned central electrode 14 by an insulator base 16 or ring separator. Gas 22 is expelled out of an orifice 15 at the tip 16 of the central electrode 14 as an electric discharge 17 is produced across the gap 18 between the outer electrode 12 and central electrode 14 thereby creating plasma 20. The gas 22 is energized by the electric discharge 17 forming ionized hot plasma 20. The plasma 20 is compressed, or pinched, due to electromagnetic forces of the electrical current through the discharge head 10 producing a highly dense source that emits EUV radiation 22.

In operation, a tremendous heat load, on the order of 5 kW/cm$^2$, is experienced by the components of the plasma head 10. The components are only a few millimeters from the plasma 20, and in an erosive environment that quickly damages the components. This erosion severely effects performance, lifetime and reliability of the discharge head 10.

The outer electrode 12 and central electrode 14 are commonly made from refractory metals, such as tungsten or molybdenum which are more resistant to the effects of extreme heat. These materials are expensive, difficult to machine, and are prone to cracking when structurally loaded under severe heating conditions. These materials, none the less, erode over time in this environment.

The components of the electrical discharge plasma head 10 are subjected to extreme heating followed by rapid cooling. In particular, this temperature environment causes extreme thermal stresses and fracture of the insulator material rendering it an ineffective insulator. Furthermore, during the rundown and pinch phases of pulsed plasma operation, damaging amounts of photon, electron, and ion radiation bombards the components. This causes erosion of the insulator material into the plasma, which has a deleterious effect on plasma formation, stability, and output power.

The common electrode insulator materials are ceramics, which include alumina and sapphire, but are prone to thermal cracking and erosion in these environments. Alternate materials, such as Nitroxyceram and IRBAS, avoid catastrophic failure but have high erosion rates as heat loads are increased.

In order for the electric discharge plasma EUV sources to meet commercial requirements and demands, including reliability and productivity, lifetime-extending improvements will have to be made for the insulator components of the electric discharge gas plasma head.

BRIEF DESCRIPTION OF DRAWINGS

FIG. 2 is a cross-sectional view of a wire mesh-reinforced diamond insulator collar in accordance with an embodiment of the present invention;

FIG. 3 is a cross-sectional view of a mandrel upon which the wire mesh reinforced diamond collar is formed and the diamond coating is applied, in accordance with an embodiment of the present invention;

FIG. 6 is a perspective view of a diamond insulator collar in accordance with an embodiment of the present invention.

DESCRIPTION

In the following detailed description, reference is made to the accompanying drawings which form a part hereof wherein like numerals designate like parts throughout, and in which is shown by way of illustration specific embodiments in which the invention may be practiced. It is to be understood that other embodiments may be utilized and structural or logical changes may be made without departing from the scope of the present invention. Therefore, the following detailed description is not to be taken in a limiting sense, and the scope of the present invention is defined by the appended claims and their equivalents.

Figure 1:
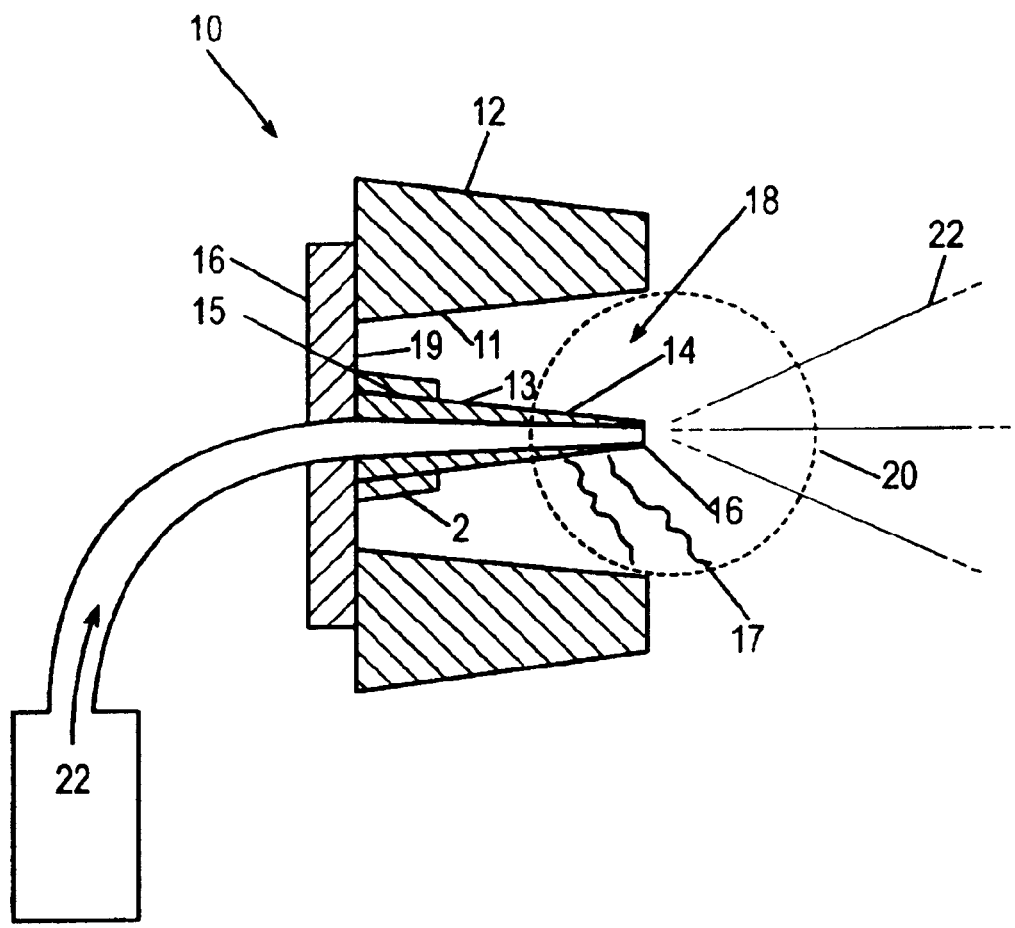
FIG. 1 is a cross-sectional view of an electric discharge gas plasma EUV source.

Embodiments of components and methods of the present invention provide electrically insulating diamond collars that slide over the central electrode of an electrical discharge gas plasma head. Referring again to FIG. 1, the electrical discharge gas plasma head 10 comprises the electrically conductive annular outer electrode 12 electrically insulated from the central electrode 14 by the insulator base 16 or ring separator. Of particular interest is the insulating collar 2 positioned at the base 15 of the central electrode 14 in the pre-ionization region of the plasma head 10. The insulating collar 2 prevents electrical shorting between the outer electrode 12 and the central electrode 14 in this region.

The insulator collar 2 is adapted to be advanced over the central electrode 14 and placed onto and closely conform to the central electrode base 15. The insulator collar 2 electrically insulates the base 15 from the outer electrode 12.

Common shapes for the base 15 include, but are not limited to, cylinder and cone.

FIG. 2 is a cross-sectional view of a wire mesh-reinforced diamond insulator collar 4 and an electrical discharge gas plasma head 12 in accordance with an embodiment of the present invention. The wire-mesh 20 conforms to the outer surface of the base 15 and provides a form upon which the diamond coating 24 is formed.

FIG. 3 is a cross-sectional view of a mandrel 22 upon which the wire mesh reinforced diamond collar 4 is formed and the diamond coating 24 is applied, in accordance with an embodiment of the present invention. The mandrel 22 matches the size and shape of the base 15 of the central electrode 14, shown in FIG. 2.

Figure 4:
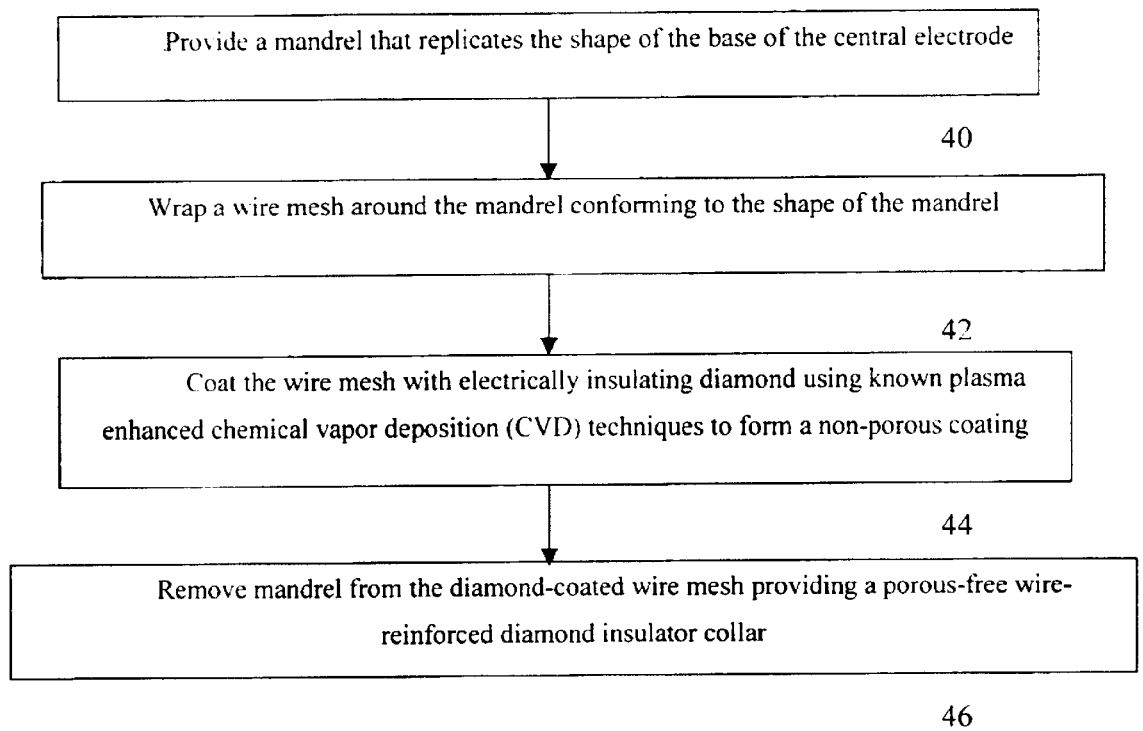
FIG. 4 is a flow-diagram of a method of providing a wire mesh-reinforced diamond insulator collar in accordance with an embodiment of the present invention.

FIG. 4 is a flow-diagram of a method of providing a wire mesh-reinforced diamond insulator collar in accordance with an embodiment of the present invention. A mandrel is provided that replicates the shape of the base of the central electrode 40. A wire mesh is wrapped around the mandrel conforming to the shape of the mandrel 42. The wire mesh is coated with electrically insulating diamond using known plasma enhanced chemical vapor deposition (CVD) techniques to form a non-porous coating 44. The mandrel is removed from the diamond-coated wire mesh providing a porous-free wire-reinforced diamond insulator collar 46.

Wherein the central electrode 14 is shaped as a cone, the wire mesh 20 is formed around a cone mandrel 22 to form a hollow cone having an inner dimension corresponding to the outer dimension of the mandrel 22. Likewise, wherein the central electrode is shaped as a cylinder, the wire mesh is formed around a cylindrical mandrel to form a tube having an inside diameter corresponding to the outer diameter of the mandrel. The mandrel 22 comprises a temperature-resistant material, such as, but not limited to, graphite or silicon.

The wire mesh 20 is comprised of a metal wire having a melting temperature in excess of 1000 degrees C. to withstand the diamond CVD deposition process. Suitable metals include, but are not limited to, molybdenum and tungsten. In an embodiment of a wire-reinforced diamond insulator collar 4 made in accordance with the present invention includes a tight weave wire mesh 20 comprising 0.1-mm diameter wire.

The wire mesh 20 and mandrel 22 are processed in a plasma enhanced CVD furnace using a mixture of hydrogen and a hydrocarbon, such as, but not limited to, methane, as process gases. Diamond coat time is predetermined to be appropriate to ensure complete coverage of the wire mesh 20 with a continuous insulating diamond coating 24. In one embodiment in accordance with a method of the present innovation, a diamond coating 24 having a thickness of 1-mm or less from inner diameter to outer diameter is provided.

Figure 5:
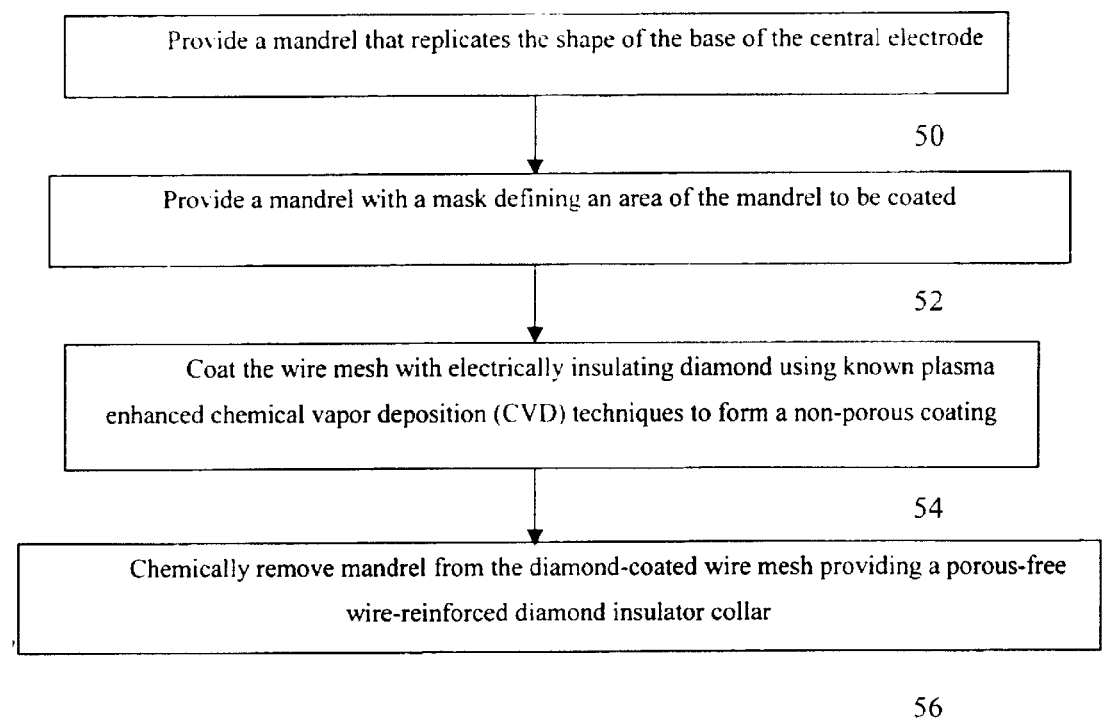
FIG. 5 is a flow-diagram of another method of providing a diamond insulator collar in accordance with an embodiment of the present invention.

FIG. 5 is a flow-diagram of another method of providing a diamond insulator collar in accordance with an embodiment of the present invention. A mandrel is provided that replicates the shape of the base of the central electrode 50. The mandrel is provided with a mask defining an area of the mandrel to be coated 52. The mandrel is coated with electrically insulating diamond using known plasma enhanced chemical vapor deposition (CVD) techniques to form a non-porous surface 54. The mandrel is chemically removed from the diamond insulator collar, providing a porous-free diamond insulator collar 56.

FIG. 6 is a perspective view of a diamond insulator collar 6 in accordance with an embodiment of the present invention. The mandrel 26 comprises a temperature-resistant but chemically-removable material. In an embodiment in accordance with the present invention, the mandrel 26 comprises silicon. The mandrel 26 is coated with an electrically insulating diamond coating 24 using known plasma enhanced CVD techniques. The resulting diamond collar 6 is separated from the mandrel 26 by preferentially etching the mandrel 26 to dissolve it. Standard Si etch chemicals include, but are not limited to, mixtures of HF and HNO3, KOH, chlorofluorocarbons and nitrogen trifluoride.

In yet another embodiment of a method in accordance with the present invention, the mandrel 26 is provided with a mask 28 which defines the portion of the mandrel that is not to be coated with the diamond coating 24, shown in FIG. 6. FIG. 7 is a flow-diagram of a method of providing a diamond insulator collar using a mandrel provided with a mask, in accordance with an embodiment of the present invention. A cone-shaped mandrel in the shape of the central electrode base is machined out of silicon 50. The mandrel is masked with a coating or removable shielding comprising graphite 52. The mandrel is placed in a plasma-enhanced CVD apparatus 54. A CVD diamond coating of up to 1-mm is deposited on the unmasked portion of the mandrel 56. The graphite coating or shielding is removed from the mandrel 58. The diamond collar is removed from the mandrel by dissolving the mandrel in a Si wet etch bath containing Si etchants 60.

In another embodiment in accordance with the present invention, the mandrel comprises a hollow Si cone having an outer dimension conforming to that of the central electrode base 41. A hollow-cone mandrel will present a larger surface area exposed to the etchant. In embodiments wherein the mandrel is chemically removed from the collar, the graphite mask may or may not need to be removed prior to etching, depending on the amount of mandrel material exposed to the bath.

Embodiments of diamond insulator collars are provided in accordance with the present invention. The diamond insulator collars have a high thermal conductivity of 20 W/cm-K, a breakdown voltage of $10^{\wedge}7$ V/cm, resistivity up to $10^{\wedge}16$ ohms, and are extremely erosion and thermal shock resistant in electrical discharge gas plasma environments.

The diamond collars, made in accordance with the present invention, are characterized by having a high thermal shock resistance, a high thermal conductivity, and sputter resistance, permitting operation of plasma source at higher power and/or extending the lifetime of the collar. The diamond collar has a high thermal shock resistance, evidenced by a relatively low thermal expansion coefficient of approximately $1 \times 10^{\wedge} -6$ and high tensile strength of approximately 290 $Kg/mm^{\wedge}2$, which resists damage during rapid cooling following pulsed operation of the electrical discharge gas plasma head. The diamond collar has a high thermal conductivity of approximately 20 W/cm-K, which enables rapid dissipation of heat transferred from the plasma. The diamond collar is resistant to high temperatures as the melting temperature is greater than >4000 C. The diamond collar is resistant to ion bombardment and radiation damage caused by extreme ultraviolet and longer wavelength photons. Further, the diamond collar has a sputtering yield of 0.2 atoms/ion in 600 eV argon, three times better tungsten.

The high thermal conductivity and tensile strength combined with small thermal expansion coefficient results in a diamond insulator collar having good thermal shock resistance. The high resistivity of approximately $10^{\wedge}16$ ohm-cm, results in a diamond insulator collar having a good electrical insulating properties. The high melting temperature results in a diamond insulator collar that can resist the hot environment.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. A method for fabricating an insulating collar for a central electrode of an electrical discharge gas plasma EUV source, comprising:
   providing a mandrel having a predetermined shape corresponding to the shape of a base portion of the central electrode;
   depositing non-electrically conductive diamond onto at least a portion of the mandrel to form a non-porous coating using a chemical vapor deposition process; and
   removing the mandrel from the coating to provide a diamond collar adapted to slide onto the base portion of the central electrode.

2. The method of claim 1, further comprising:
   forming a wire mesh around the mandrel conforming to the shape of the mandrel and of a predetermined size corresponding to the base portion of the central electrode to be insulated, wherein depositing non-electrically conductive diamond onto at least a portion of the mandrel to form a non-porous coating comprises depositing non-electrically conductive diamond onto the wire mesh to form a non-porous coating.

3. The method of claim 2, wherein forming a wire mesh around the mandrel comprises forming a wire mesh around the mandrel, the wire mesh comprising wire selected from the group consisting of molybdenum and tungsten.

4. The method of claim 2, wherein providing a mandrel comprises providing a mandrel comprising material selected from the group consisting of graphite and silicon.

5. The method of claim 2, wherein depositing non-electrically conductive diamond onto at least a portion of the mandrel to form a non-porous coating using a chemical vapor deposition process comprises:
   depositing non-electrically conductive diamond onto at least a portion of the mandrel to form a non-porous coating using a chemical vapor deposition process in a plasma enhanced CVD furnace using a mixture of hydrogen and a hydrocarbon, the diamond coating having a thickness of 1-mm or less.

6. The method of claim 1, wherein depositing non-electrically conductive diamond onto at least a portion of the mandrel to form a non-porous coating using a chemical vapor deposition process comprises:
   masking the mandrel defining an exposed area of the mandrel to be coated;
   depositing non-electrically conductive diamond onto the exposed area of the mandrel to form a non-porous coating using a chemical vapor deposition process; and, wherein removing the mandrel from the coating to provide a diamond collar adapted to slide onto the base portion of the central electrode comprises:
   removing the mandrel from the coating using chemical means providing a porous-free diamond insulator collar.

7. The method of claim 6 wherein masking the mandrel defining an exposed area of the mandrel to be coated comprises:
   masking the mandrel with a coating or removable shielding comprising graphite defining an exposed area of the mandrel to be coated.

8. The method of claim 6, wherein depositing non-electrically conductive diamond onto the exposed area the mandrel to form a non-porous coating using a chemical vapor deposition process comprises:
   depositing non-electrically conductive diamond onto the exposed area the mandrel to form a non-porous coating using a chemical vapor deposition process in a plasma enhanced CVD furnace using a mixture of hydrogen and a hydrocarbon, the diamond coating having a thickness of 1-mm or less.

9. The method of claim 6, wherein removing the mandrel from the coating using chemical means comprises:
   removing a silicon mandrel from the coating by dissolving the mandrel in a Si wet etch bath containing Si etchants.

10. The method of claim 9, wherein removing a silicon mandrel from the coating by dissolving the mandrel in a Si wet etch bath containing Si etchants comprises:
    removing a silicon mandrel from the coating by dissolving the mandrel in a Si wet etch bath containing etchants selected from the group consisting of mixtures of HF and HNO3, KOH, chlorofluoracarbons and nitrogen trifluoride.

11. The method of claim 6, wherein removing the mandrel from the coating using chemical means comprises:
    removing the mask from the mandrel; and
    dissolving the mandrel in a Si wet etch bath containing Si etchants.

12. An EUV source, comprising:
    an outer electrode having a substantially annular configuration;
    a central electrode having a base portion, the central electrode coaxial with the outer electrode;
    a base insulator adapted to separate the outer from the central electrode; and
    a diamond collar having an inner surface adapted to conform to the shape of the base portion, the base portion positioned within the diamond collar insulating the base portion from the outer electrode, wherein the method for fabricating the diamond collar comprises:
    providing a mandrel having a predetermined shape corresponding to the shape of the base portion of the central conductor;
    depositing diamond onto at least a portion of the mandrel to form a non-porous diamond coating using a chemical vapor deposition process; and
    removing the mandrel from the coating to provide the diamond collar adapted to slide onto the base portion of the central electrode.

13. The EUV source of claim 12, wherein the method for fabricating the diamond collar further comprises:
    forming a wire mesh around the mandrel conforming to the shape of the mandrel and of a predetermined size corresponding to the portion of the central electrode to be insulated, wherein depositing non-electrically conductive diamond onto at least a portion of the mandrel to form a non-porous coating comprises depositing non-electrically conductive diamond onto the wire mesh to form a non-porous coating.

14. The EUV source of claim 13, wherein forming a wire mesh around the mandrel comprises forming a wire mesh around the mandrel, the wire mesh comprising wire selected from the group consisting of molybdenum and tungsten.

15. The EUV source of claim 13, wherein providing a mandrel comprises providing a mandrel comprising material selected from the group consisting of graphite and silicon.

16. The EUV source of claim 13, wherein depositing non-electrically conductive diamond onto at least a portion of the mandrel to form a non-porous coating using a chemical vapor deposition process comprises:

depositing non-electrically conductive diamond onto at least a portion of the mandrel to form a non-porous coating using a chemical vapor deposition process in a plasma enhanced CVD furnace using a mixture of hydrogen and a hydrocarbon, the diamond coating having a thickness of 1-mm or less.

17. The EUV source of claim 12, wherein depositing non-electrically conductive diamond onto at least a portion of the mandrel to form a non-porous coating using a chemical vapor deposition process comprises:

masking the mandrel defining an exposed area of the mandrel to be coated;

depositing non-electrically conductive diamond onto the exposed area the mandrel to form a non-porous coating using a chemical vapor deposition process; and, wherein removing the mandrel from the coating to provide a diamond collar adapted to slide onto the base portion of the central electrode comprises:

removing the mandrel from the coating using chemical means providing a porous-free diamond insulator collar.

18. The EUV source of claim 17 wherein masking the mandrel defining an exposed area of the mandrel to be coated comprises:

masking the mandrel with a coating or removable shielding comprising graphite defining an exposed area of the mandrel to be coated.

19. The EUV source of claim 17, wherein depositing non-electrically conductive diamond onto the exposed area the mandrel to form a non-porous coating using a chemical vapor deposition process comprises:

depositing non-electrically conductive diamond onto the exposed area the mandrel to form a non-porous coating using a chemical vapor deposition process in a plasma enhanced CVD furnace using a mixture of hydrogen and a hydrocarbon, the diamond coating having a thickness of 1-mm or less.

20. The EUV source of claim 17, wherein removing the mandrel from the coating using chemical means comprises:

removing a silicon mandrel from the coating by dissolving the mandrel in a Si wet etch bath containing Si etchants.

21. The EUV source of claim 17, wherein removing the mandrel from the coating using chemical means comprises:

removing the mask from the mandrel; and dissolving the mandrel in a Si wet etch bath containing Si etchants.

22. An EUV source, comprising:

an outer electrode having a substantially annular configuration;

a central electrode having a base portion, the central electrode coaxial with the outer electrode;

a base insulator adapted to separate the outer from the central electrode; and a diamond collar having an inner surface adapted to conform to the shape of the base portion, the diamond collar positioned to insulate the base portion from the outer electrode.

23. The EUV source of claim 22, wherein the diamond collar is adapted to electrically insulate the base portion from the annular outer electrode in a pre-ionization region defined by the base portion.

24. The EUV source of claim 22, wherein the central electrode includes a gas discharge tip, and the EUV source further comprising:

a gas source adapted to provide gas to the gas discharge tip.

25. The EUV source of claim 24, further comprising:

a voltage source adapted to drive an arc between the central electrode and the outer electrode in the presence of the gas exciting the gas to a high density plasma, the plasma compressed by electromagnetic forces from the outer electrode and central electrode.

26. The EUV of claim 22, wherein the central electrode has a conical shape.

* * * * *

UNITED STATES PATENT AND TRADEMARK OFFICE
CERTIFICATE OF CORRECTION

PATENT NO. : 6,847,044 B2
DATED : January 25, 2005
INVENTOR(S) : Rice et al.

It is certified that error appears in the above-identified patent and that said Letters Patent is hereby corrected as shown below:

Column 6,
Lines 13-14 and 17, "...area the mandrel..." should read -- ...area of the mandrel... --;
Line 56, "central conductor" should read -- central electrode --;

Column 7,
Lines 46-47, "...area the mandrel..." should read -- ...area of the mandrel... --; and Column 8,
Line 2, "...area the mandrel..." should read -- ...area of the mandrel... --.

Signed and Sealed this

Twenty-first Day of February, 2006

JON W. DUDAS
*Director of the United States Patent and Trademark Office*